United States Patent [19]

Nishizawa

[11] 4,315,796
[45] Feb. 16, 1982

[54] CRYSTAL GROWTH OF COMPOUND SEMICONDUCTOR MIXED CRYSTALS UNDER CONTROLLED VAPOR PRESSURE

[75] Inventor: Jun-ichi Nishizawa, Sendai, Japan

[73] Assignee: Zaidan Hojin Handotai Kenkyu Shinkokai, Sendai, Japan

[21] Appl. No.: 44,214

[22] Filed: May 31, 1979

Related U.S. Application Data

[63] Continuation-in-part of Ser. No. 806,836, Jun. 15, 1977, abandoned.

[30] Foreign Application Priority Data

Mar. 10, 1978 [JP] Japan .................................. 51-101417

[51] Int. Cl.³ ............................................. C30B 25/02
[52] U.S. Cl. ...................................... 156/614; 156/622
[58] Field of Search ...................... 156/609, 614, 622; 148/174, 175; 427/87

[56] References Cited

U.S. PATENT DOCUMENTS 3,301,637 1/1967 Kucza .................................. 156/614
3,902,860 9/1975 Akai .................................... 156/609

FOREIGN PATENT DOCUMENTS 1353917 5/1974 United Kingdom .

OTHER PUBLICATIONS

Nishizawa et al., Hot Crystal Growth 31, (1975) pp. 215-222.

Primary Examiner—Hiram Bernstein
Attorney, Agent, or Firm—Cushman, Darby & Cushman

[57] ABSTRACT

A compound semiconductor mixed crystal is grown by causing semiconductor-constituent material to travel, in dissolved liquid phase, through a solution having a portion contacting the source material and held at a constant high temperature and another portion wherein growth of the mixed crystal takes place and held at a constant low temperature, while externally applying onto the surface of said solution vapor pressures of the material-constituting separately generated volatile elements. The vapor pressures of such volatile elements applied to the solution are determined by the measurement, as a function, of at least one physical property of the mixed crystal thus produced. Optimum vapor pressures of these elements may be effectively determined by successively growing, under the same conditions, two layers forming a light-emitting diode and by measuring the luminance of this diode. Mixed crystals grown by this method under optimum vapor pressures provide excellent performance as indicated by various physical properties.

23 Claims, 11 Drawing Figures

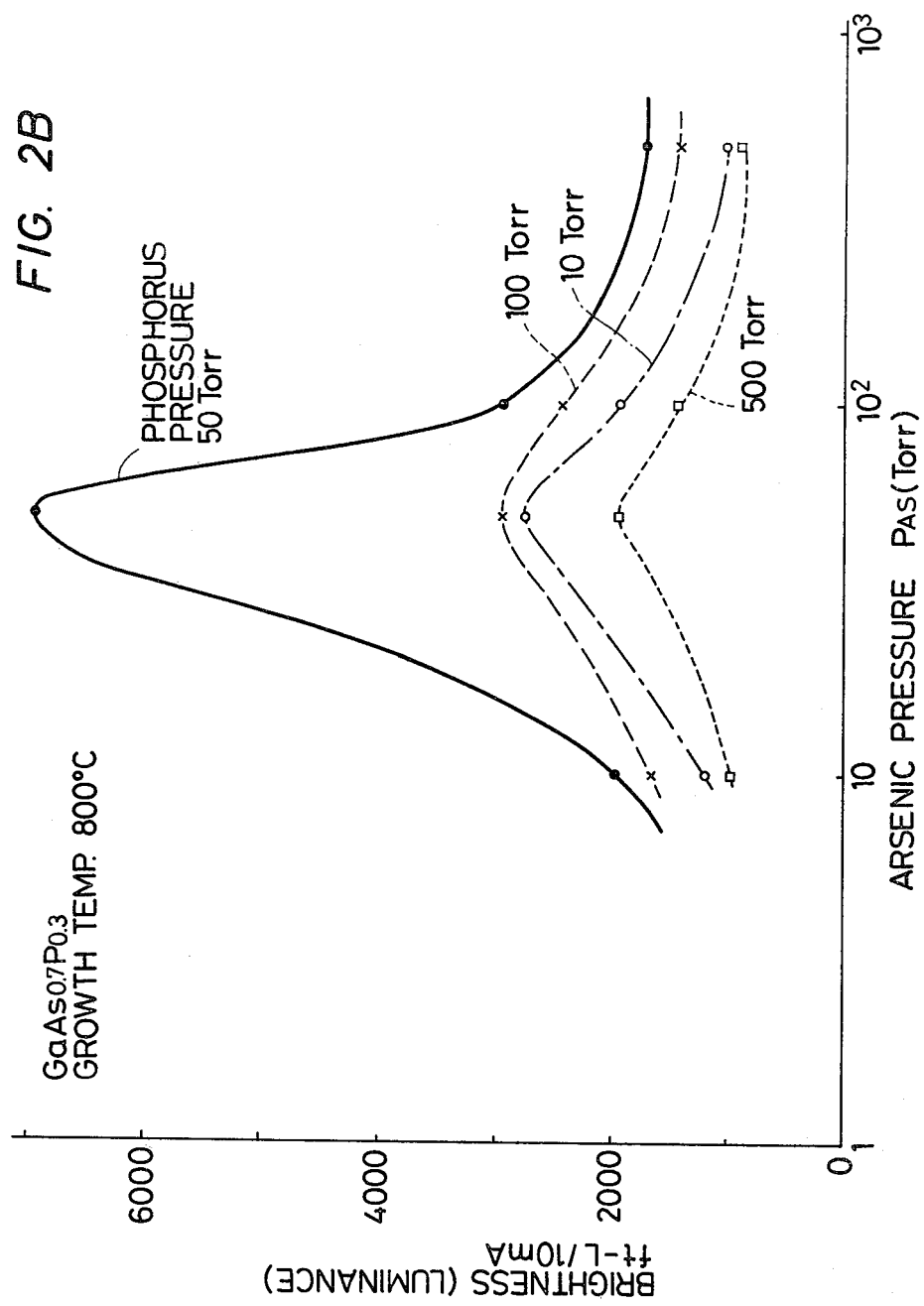

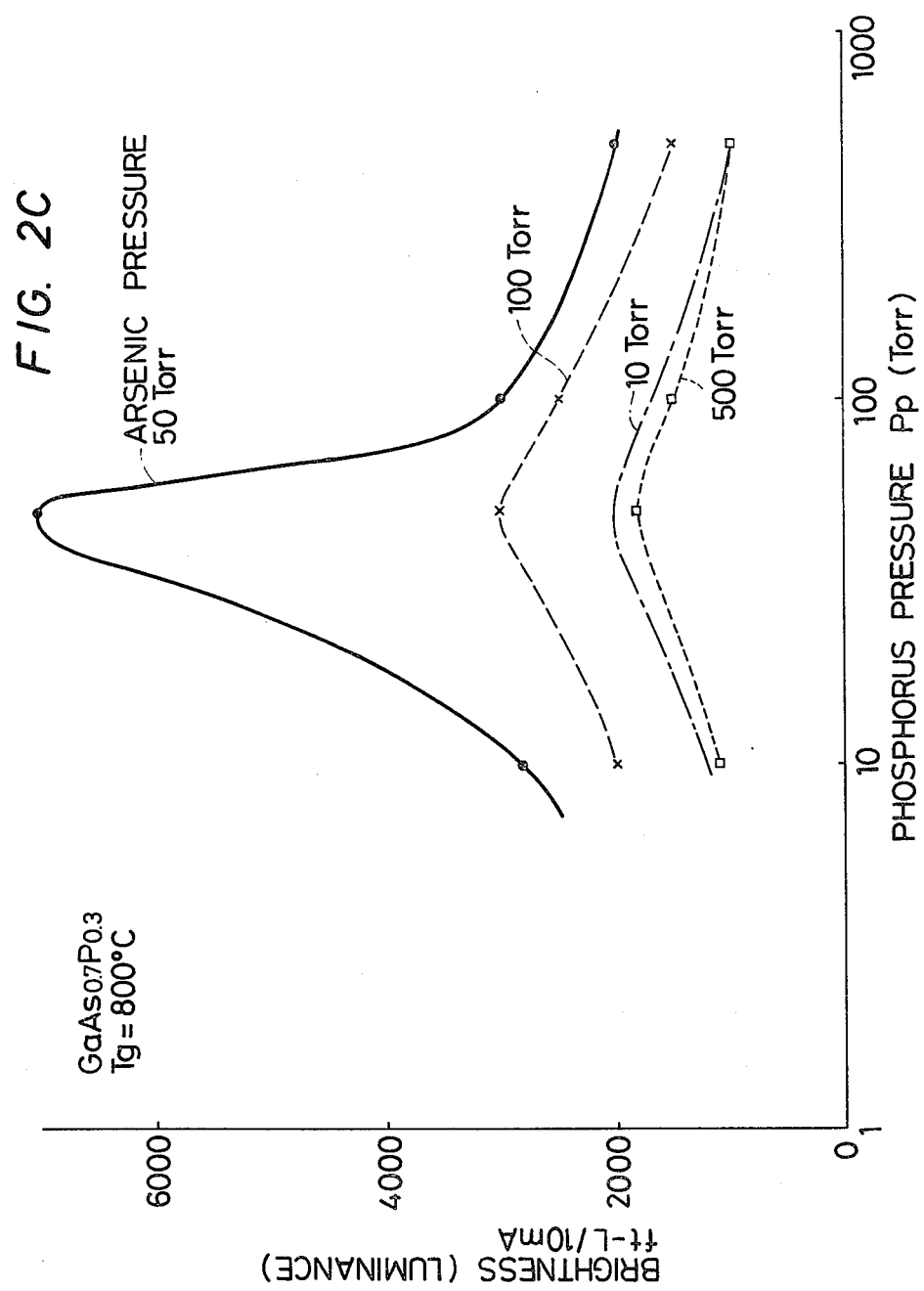

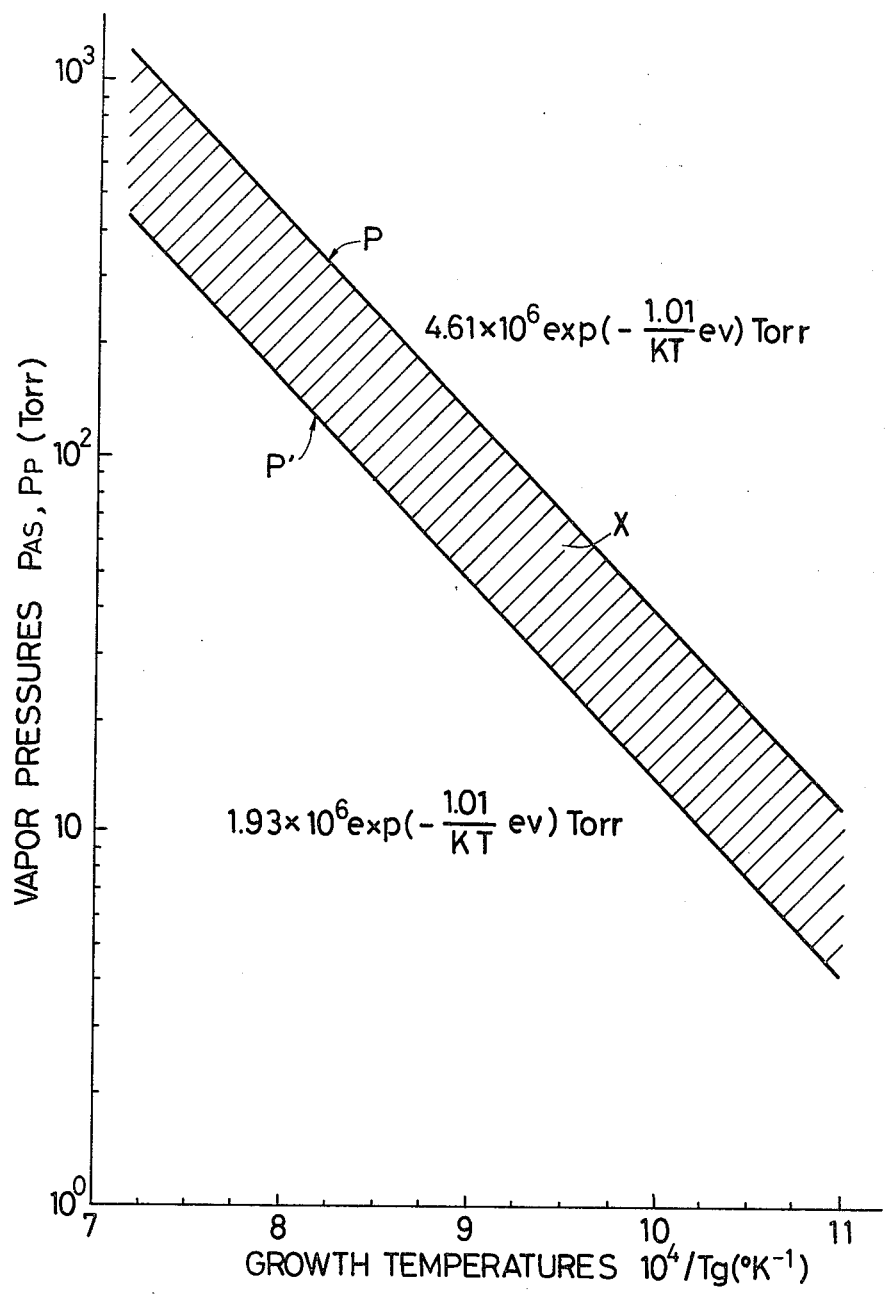

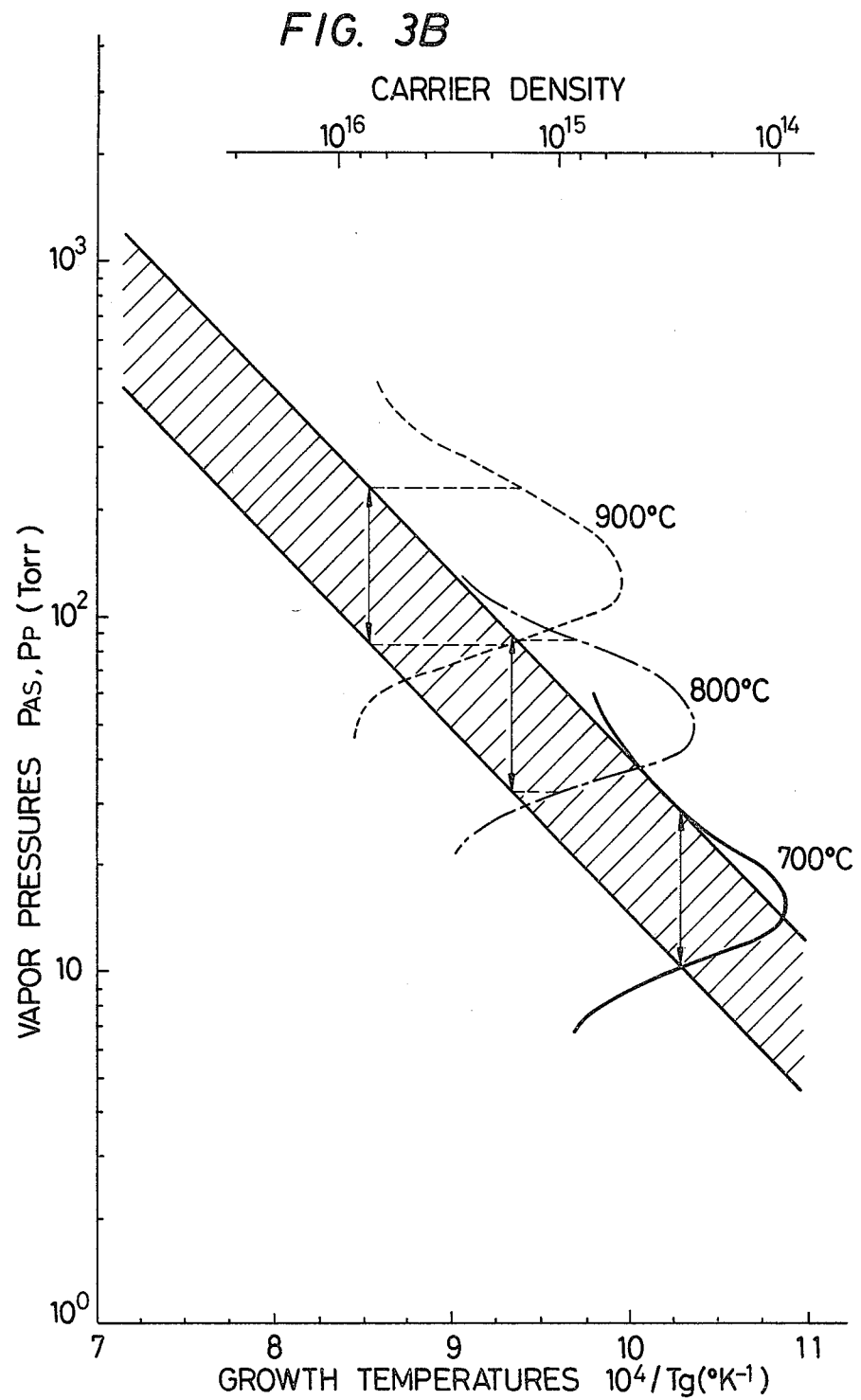

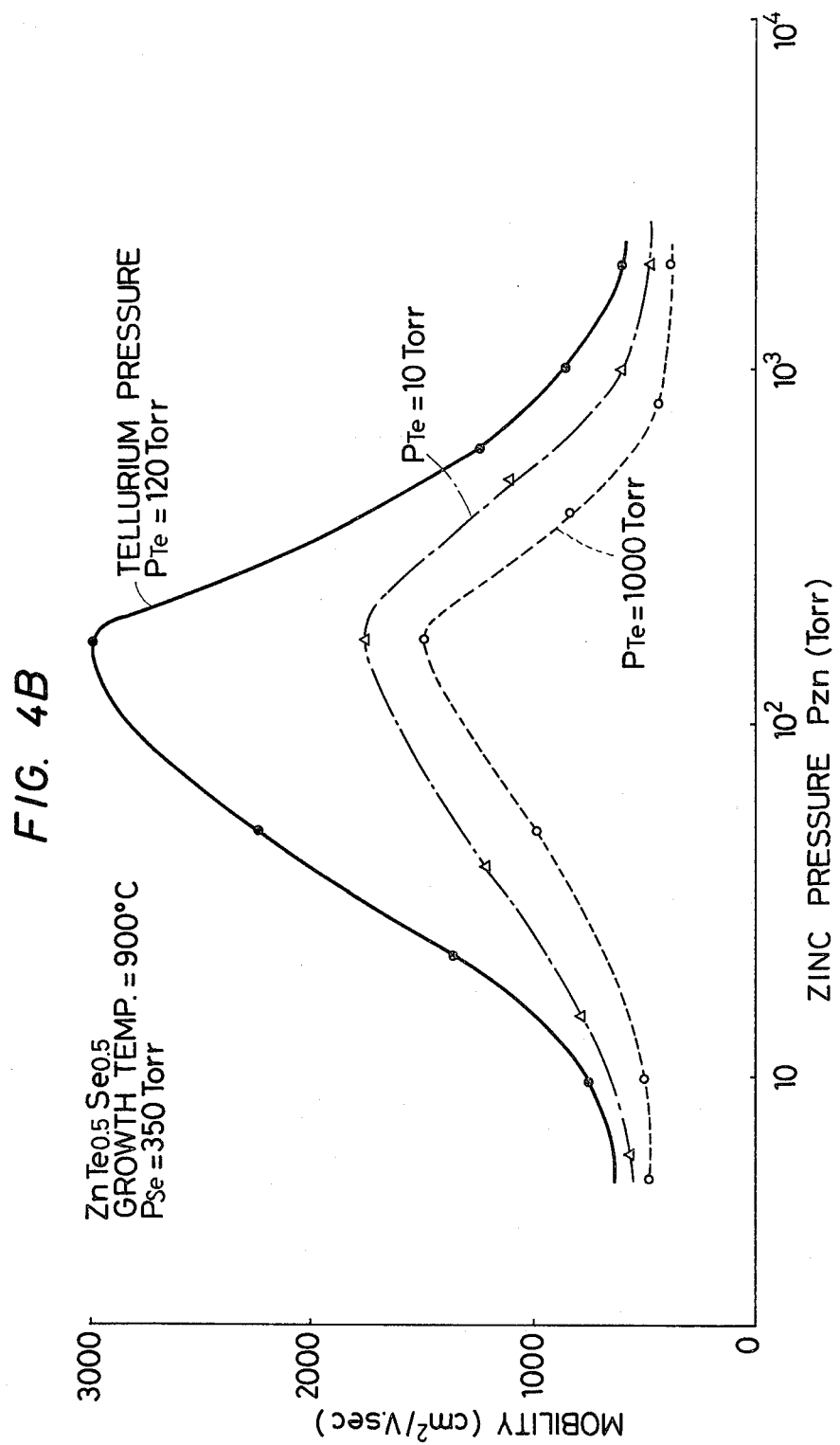

CRYSTAL GROWTH OF COMPOUND SEMICONDUCTOR MIXED CRYSTALS UNDER CONTROLLED VAPOR PRESSURE

CROSS REFERENCE TO RELATED APPLICATION

This is a continuation-in-part of my copending application Ser. No. 806,836 filed June 15, 1977, abandoned after the filing hereof.

BACKGROUND OF THE INVENTION a. Field of the Invention

The present invention relates to crystal growth, and more particularly it pertains to solution growth of compound semiconductor mixed crystals containing at least one constituent volatile element, through external application of a controlled vapor pressure of said constituent volatile element.

b. Description of the Prior Art

Various methods have been proposed for growing semiconductor crystals. Such various methods can be roughly classified into the melt growth method and the solution growth method. Melt growth is advantageous in respect of high growth rate, but the inherent properties of the substance to be crystallized, such as melting point, viscosity, etc., impose various limitations to the crystal growth. Solution growth, on the other hand, provides for the advantage that the properties of the substance can be modified in various ways such as lowering the growth temperature, lowering the viscosity, etc.

Higher growth temperature gives rise to more lattice defects, higher dissociation pressure, and the like as well as the disadvantage that said higher temperature, itself, may bring about practical problems including the desinging of heating means. Therefore, from the point of perfect crystallography, it is desirable to grow crystals at a temperature as low as possible, and therefore, the solution growth is very advantageous in this respect. However, deposition of crystal from a solution would lead to compositional changes of the solution. Compositional change of the solution should change various parameters of the crystal growth.

Solution growth of the temperature difference method (TDM) proposed by the present inventor is very advantageous in that the growth temperature can be lowered by the use of a solution, and the composition of the solution can be kept constant by continuously dissolving source material(s) to the saturation concentration at the higher temperature portion. It may be compared with the floating zone growth method wherein a molten zone runs along a source ingot.

For growing a compound semiconductor crystal such as III-V compound or II-VI compound semiconductor crystal, there exists another problem, i.e. a high dissociation pressure which leads to evaporation of a volatile component and hence deviation from stoichiometry. Deviation from stoichiometry first introduces lattice defects since there is a deficiency of one component. If the deviation from stoichiometry is large, there may be no chance of growing the desired single crystal. For suppressing such evaporation of a volatile component and hence deviation from stoichiometry, application of vapor pressure of the volatile component is recommended. Usually, it has been considered that application of the equilibrium pressure is sufficient to keep the stoichiometry.

Usually, however, little care had been taken to precisely control the vapor pressures during crystal growth, excepting those for preventing evaporation or dissociation of source material.

Liquid encapsulation may be used for preventing evaporation of a material located at a high temperature zone as well as for protecting it from contamination. Liquid encapsulation of GaP with $B_2O_3$ or $BaCl_2$ layer was proposed (J. Crystal Growth 3, 286 (1968)). However, evaporation cannot be completely avoided by such liquid encapsulation, and some part of said material located at said high temperature zone evaporates away through the covering layer. Furthermore, the covering substance may be introduced into the grown crystal.

In U.S. Pat. No. 3,902,860 to Akai et al., compound semiconductors having a high dissociation pressure are produced without the use of a sealed reaction tube and under a controlled vapor pressure of a volatile component contained therein. The vapor of a volatile component is arranged to bubble through a molten source material while maintaining a pressure balance between an enclosed chamber and an outer chamber for preventing destruction of the enclosed chamber. The pressure is adjusted to a level lower than the equilibrium pressure.

Experiments by the present inventor (and his colleagues) have revealed that application of such an accepted equilibrium pressure is not sufficient to achieve the correct stoichiometry and perfect crystallization.

On the other hand, there also has been proposed a theory that the stoichiometric composition of a crystal can be spontaneously achieved throughout the crystal growth only by controlling the temperature of the melt to produce a desired pressure of a constituent component, because the pressure of the constituent component would be automatically determined by the temperature of the melt.

Further, according to the solution growth method, the vapor pressure of a constituent volatile element can be reduced due to lowering of the growth temperature and also due to reduction in the molar ratio of the solute source material in the solution.

Therefore, the relation of stoichiometry in a melt or solution to the vapor pressure of volatile elements has not been seriously considered and not analyzed in detail. It has been found, however, that the compound semiconductor crystal produced by the conventional method has a large deviation of composition from stoichiometry.

With the increase in industrial demand and the progress in crystal growth technique, it has become necessary to produce reliable and long-life semiconductor devices by using crystals of higher quality and higher purity. It is considered that the most serious problems in compound semiconductor crystals are caused by deviation from stoichiometric composition, for example, the crystal lattice of III-V compound GaAs must consists of the same number of Ga and As atoms. That is, the last and greatest barrier in the production of crystals of highest quality is to avoid such deviation from stoichiometric composition.

The present inventor has found that deviation from stoichiometry in a compound semiconductor can be controlled precisely and can be minimized by precisely controlling the vapor pressure of a volatile element employed, and that the vapor pressure of at least one volatile element must be precisely controlled for achieving stoichiometry in the crystal produced. The vapor pressure to be applied should be a function of temperature employed. The optimum vapor pressure has been found to be far greater than the accepted equilibrium pressure, especially at lower temperatures.

For growing a perfect compound semiconductor crystal, the present inventor has proposed the temperature difference method under controlled vapor pressure (TDM-CVP), which is basically a method of growing crystals at a fixed temperature under controlled vapor pressures for obtaining stoichiometry in a compound semiconductor (e.g. J. Crystal Growth 31, 215 (1975)). The growth temperature can be reduced by the use of a solution. An extremely high-quality crystal can be grown at a fixed temperature and at a fixed rate by establishing a temperature difference in the solution and by dissolving a source material continuously up to the saturation concentration in a high temperature portion of the solution. Further, a precisely controlled vapor pressure of a volatile component is applied externally on to the surface of the solution to thereby minimize deviation from stoichiometry. The optimum vapor pressure to be applied to the solution is determined from the measurement of an appropriate physical property of a grown crystal as a function of applied vapor pressure.

Mixed crystals, especially compound semiconductor mixed crystals, are attracting the attention of those concerned for the reason that they provide for semiconductors of arbitrary band gap, etc. The growth of mixed crystals, however, is not always analogous to that of elementary or compound semiconductors since mixed crystals require microscopic chemical (or compositional) disorder and yet macroscopic chemical uniformity. Behavior of mixed crystals is not always intermediate of terminal materials. Further, growth of a mixed crystal usually occurs as being of a composition different from that of the source, so that the grown crystal may have a compositional gradient even when stoiciometry is attained. Attainment of stoichiometry, microscopic chemical disorder and microscopic uniformity is considered to be the most important problem for growing mixed crystals.

SUMMARY OF THE INVENTION

It is, therefore, an object of the present invention to provide a method of growing a compound semiconductor mixed crystal having correct stoichiometry, macroscopic chemical uniformity and microscopic chemical disorder.

Another object of the present invention is to provide a method for growing a compound semiconductor mixed crystal, which employs the solution growth of a temperature difference method under the controlled vapor pressure of material-constituting elements, and provides extremely high quality of the compound semiconductor mixed crystals thus grown.

A further object of the present invention is to provide an apparatus for growing a compound semiconductor mixed crystal to be obtained according to the above-mentioned method.

For growing a compound semiconductor mixed crystal of uniform and high quality from a solution, growth conditions should be kept as constant as possible. Changes and/or fluctuations in growth temperature, solute composition and solute concentration in the solution or the like tend to easily introduce changes and/or fluctuations in composition, macroscopic uniformity, microscopic disorder or physical properties in the grown mixed crystal. Attainment of stoichiometry is also very important.

According to an aspect of the present invention, growth conditions for a compound semiconductor mixed crystal are kept constant by establishing a predetermined temperature difference in a solution, dissolving a source material in the solution up to the saturation concentration at the high temperature portion of the solution, and growing a compound semiconductor mixed crystal of the same composition as that of the source material at the low temperature portion of said solution, while externally applying predetermined vapor pressures of constituent volatile elements onto the surface of this solution. When the source (solute) material has a specific gravity lower than that of the solvent, such as the growth of $GaAs_{1-x}P_x$ from Ga solution, it is preferable to establish a vertical temperature difference and to float the source material on the solution and grow the mixed crystal at the bottom of this solution.

Vapor pressures to be applied should be determined from the measurement of at least one physical property of the mixed crystal grown at a constant temperature as a function of the applied vapor pressure.

Stoichiometry in a compound semiconductor mixed crystal can be attained by controlling the vapor pressures of volatile constituent elements so as to be at optimum values.

Vapor pressure of a volatile element may be produced by heating a vapor source substance at a predetermined temperature and by transferring this vapor to the solution through a thin pipe.

Further objects and features as well as the advantages of the present invention will become apparent from the following detailed description of the preferred embodiments made in conjunction with the accompanying drawings.

BRIEF DESCRIPTION OF THE DRAWINGS

FIGS. 2B and 2C are graphs representing the relation between brightness (luminance) of $GaAs_{0.7}P_{0.3}$ light-emitting diodes and vapor pressure of arsenic and phosphorus applied during crystal growth.

FIG. 3A is a graph representing the relation between growth temperatures and optimum vapor pressures.

FIG. 3B is a graphical representation of the relation between the carrier density and both the growth temperature and the applied vapor pressure.

FIG. 4B is a graph representing the relation between mobility of carriers in $ZnTe_{0.5}Se_{0.5}$ mixed crystal and applied vapor pressure.

DETAILED DESCRIPTION OF THE PREFERRED EMBODIMENTS

Figure 1:
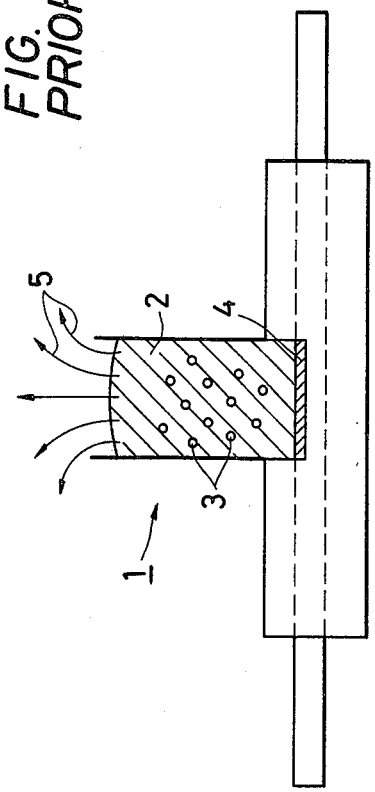
FIG. 1 is a schematic illustration of a crystal growth crucible according to the conventional art.

In some respects, compound semiconductor mixed crystals cannot be considered in the same manner as elementary or compound semiconductor crystals. Importance of stoichiometry is the same as in the compound semiconductors. Further, mixed crystals inevitably have microscopic compositional disorder. For example, in $GaAs_xP_{1-x}$ (where, $0<x<1$), although the position of the Group V element (As or P) is defined, it is uncertain which one of As and P atoms will come to one particular site. Nevertheless, the mixed crystal should have as uniform a composition distribution as possible.

Generally, mixed crystals exhibit intermediate properties between those of the terminal materials of both end compositions (e.g. GaAs and GaP in the system of $GaAs_xP_{1-x}$). Linear change of the lattice constant in mixed crystals is known as Vegard's law. However, there is no insurance for the validity of Vegard's law for a variety of mixed crystals. Indeed, there is no reason to assume Vegard's-law-like behavior for other physical properties.

Furthermore, since Group II, V and VI elements generally have high vapor pressures, deviation from the stoichiometry occurs easily in compound semiconductor mixed crystals including those volatile elements.

To obtain a uniform composition distribution throughout a grown crystal, it is necessary to keep various parameters at fixed values throughout the crystal growth. Solution growth of temperature difference method (TDM) is extremely adaptable for this purpose, because crystal growth is achieved at a fixed low temperature portion of a solution and because source or raw material continuously dissolves into the solution at a fixed high temperature portion up to saturation concentration. To obtain stoichiometry throughout a grown mixed crystal, it is necessary to apply vapor pressures of a required precise amount.

Therefore, the temperature difference method under controlled vapor pressure (TDM-CVP) is considered to be the method most appropriate for growing very high quality compound semiconductor mixed crystals.

The present invention is to propose a method for obtaining the correct stoichiometry and perfect crystallization in mixed crystals. Namely, it is recommended to measure some physical property (such as luminance or mobility) as function of applied vapor pressure(s) and to determine the optimum vapor pressure of said "mixed crystal" (not the estimated pressure, such as dissociation pressure or optimum vapor pressure estimated from those of the terminal materials by the use of Vegard's law). Then, application of such optimum pressure(s) will ensure stoichiometry as well as better physical properties. The growth temperature is lowered by the use of a solution and is kept constant by the use of the temperature difference method. Mixed crystals of a predetermined composition are grown under various pressures at a constant temperature, and some physical property (such as mobility or luminance) of those grown crystals is plotted as a function of applied vapor pressure to obtain optimum pressures at which the above-said physical property exhibits optimum performance. Then, a crystal of the same composition is grown at the same temperature under application of the optimum pressure.

When it is found that a linear relation exists between the logarithm of the optimum pressures and the inverse of the absolute temperature, the optimum pressures at other temperatures can be estimated.

The present invention concerns the growth of compound semiconductor mixed crystals as will be exemplified below.

(III)–(V) mixed crystals which are the mixed crystals of at least two III-V compound semiconductors:

Typical examples are as follows.

(a) (III,III)–V mixed crystals such as (In, Ga)p, (In, Ga)As, (In, Ga)Sb, (Ga, Al)P, (Ga, Al)As, (Ga, Al)Sb, (In, Ga)N, (Ga, Al)N (In, Al)P, (In, Al)Sb, (In, Al)As and (IN, Al)N. In these cases, it is necessary to control the vapor pressures of group-V elements such as P, As, N and Sb.

(b) III–(V,V) mixed crystals such as Ga(As, P), In(As,P), Al(As, P), In(As, Sb), Ga(As, Sb), Ga(P, Sb), Al(As, Sb), Al(P, Sb), Ga(P, N) and Al(P, N). In these cases, it is necessary to control all the group-V elements having higher vapor pressures.

When quaternary mixed crystals such as (Al, Ga) (As, P), (In, Ga) (As, P), (In Al) (As, P), (IN, Ga) (Sb, As), (Al, Ga) (P, Sb) and Al(As, P, Sb) are prepared, it is necessary to carry out the crystal growth under the controlled vapor pressures of all the group-V elements.

(II)–(VI) mixed crystals which are the mixed crystals of at least two II-VI compound semiconductors:

Since the vapor pressures of group-II elements and group-VI elements generally are both high, it is preferable to control all the vapor pressures of the constituent elements.

Typical examples are as follows.

(c) (II,II)–VI mixed crystals such as (Zn, Cd)S, (Zn, Hg)S, (Hg, Cd)S, (Zn, Cd)Se, (Zn, Hg)Se, (Hg, Cd)Se, (Zn, Cd)Te, (Zn, Hg)Te and (Cd, Hg)Te.

(d) II–(VI,VI) mixed crystals such as Zn(S, Se), Cd(S, Se), Hg(S, Se), Zn(S, Te), Cd(S, Te), Hg(S, Te), Zn(Se, Te), Cd(Se, Te) and Hg(Se, Te).

Generally speaking, when a mixed crystal includes group-II, group-V, and/or group-VI element(s), it is preferable to grow the mixed crystals under the controlled vapor pressure of these elements.

Other mixed crystals:

When (II)–(III)–(VI) mixed crystals such as those among $A^{II}B_2^{III}C_4^{VI}$ compounds such as $CdIn_2S_4$, $CdIn_2Se_4$, $HgIn_2S_4$, $HgIn_2Se_4$, $ZnIn_2S_4$ and $ZnIn_2Se_4$ are prepared, the vapor pressure control of both the group-II and group-VI elements is necessary.

When (II)–(IV)–(V) mixed crystals such as those among $A^{II}B^{IV}C_2^V$ compounds as $CdGeAs_2$, $CdSnP_2$, $CdGep_2$ and $ZnSnP_2$ is prepared, the vapor pressure control of both the group-II and group-V elements are necessary.

It is also preferable to carry out the crystals growth under the controlled vapor pressure of one or more constituent elements when the following mixed crystals are prepared:

(IV)–(VI) mixed crystals such as (Pb, Sn)Te, (Ge, Si)Te, Ge(Te, S) and Si(Se, Te);

(I)–(III)–(VI) mixed crystals such as those among $A^IB^{III}C_2^{VI}$ compounds such as $CuAlS_2$, $CuGaS_2$, $CuAlSe_2$, $AgInS_2$ and $AgAlTe_2$;

(I)–(V)–(VI) mixed crystals such as those among $Cu_3PS_4$, $AgAsS_2$ and $Ag_3AsS_3$;

(II)–(VI)–(VII) mixed crystals such as those among $A_3^{II}B_2^{VI}C_2^{VII}$ compounds such as $Hg_3S_2Cl_2$, $Zn_3Se_2Cl_2$ and $Cd_3Te_2Cl_2$; and (III)–(IV)–(VI) mixed crystals such as those among $A^{III}B^{IV}C_2^{VI}$ compounds such as $GaGeTe_2$, $InSnTe_2$ and $InSiTe_2$.

It will be apparent that similar application of controlled vapor pressure is preferable in mixed crystal growth of those compounds belonging to different groups. For example, mixed crystals of IV–V compounds and IV–VI compounds denoted by (IV–V, IV–VI) in this specification, such as (GeAs, GeS), (GeP, GeSe) and (SnP, SnTe), are preferably grown under application of controlled vapor pressures of one or more volatile constituent elements.

Other examples are:

(I–VII, III–V) mixed crystals such as CuCl-Gap, CuCl-GaAs and CuBr-InAs; (II–IV–V, III–V) mixed crystals including $A^{II}B^{IV}C_2^{V}$-$D^{III}E^{V}$ system such as $CdGeP_2$-GaP, $HgSiAs_2$-GaAs, and $ZnGeP_2$-InAs;

(IV–VI, III–V) mixed crystals such as GeTe-GaAS, SiS-Gap and SnSe-GaSb; (I–III–VI, II–VI) mixed crystals including $A^{I}B^{III}C_2^{VI}$-$D^{II}E^{VI}$ system such as $CuAlS_2$-ZnS, $CuGaS_2$-ZnSe and $AgAlSe_2$-CdTe; and (II–VI, IV–VI) mixed crystals such as ZnTe-PbTe, CdSe-PbS and HgTe-SiTe.

In the following, the present invention will be described in more detail with reference to the accompanying drawings.

FIG. 1 is a schematic illustration of a boat for use in a conventional liquid-phase epitaxial growth. In this boat 1, source crystals 3 are put in a solvent 2 of Ga, In or the like and the crystal growth is carried out by lowering the temperature of the solution on a substrate crystal 4. During this crystal growth process, high vapor pressure elements 5 such as AS and P evaporate from the boat 1.

EXAMPLE 1

Figure 2A:
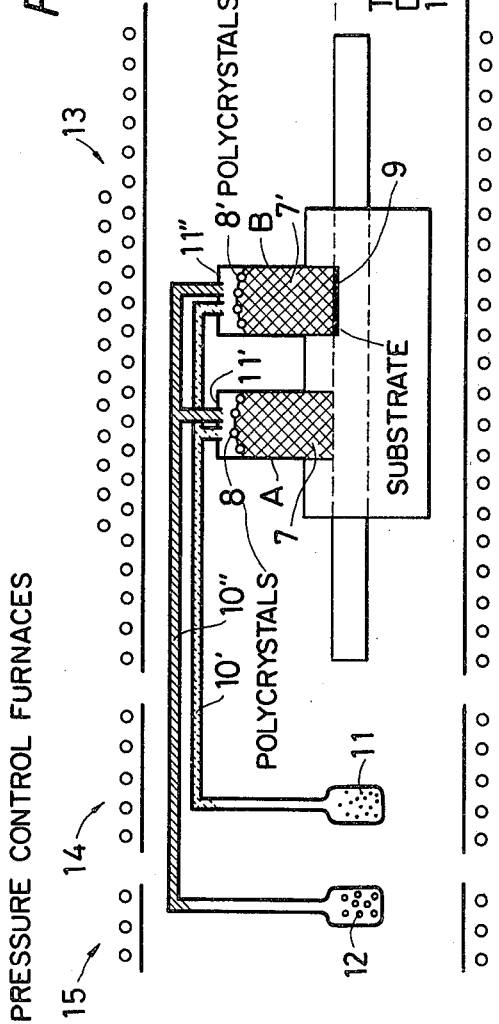
FIG. 2A is a schematic vertical sectional view of a crystal growth apparatus according to an embodiment of the present invention.

With reference to FIG. 2A, an example of the TDM-CVP according to the present invention will be described in which double epitaxial layers of $GaAs_{1-x}P_x$ are formed on a substrate under controlled vapor pressures of two group-V elements As and P. Source materials are located in contact with the solutions at the high temperature portion (in this case floated on the solutions) and epitaxial layers, which have the same composition as the source material, are grown on a substrate. Accordingly, the composition x of the epitaxial layer is determined by the composition x of the source material. It is to be noted that coincidence of the composition of the grown crystal with the source material enables the establishment of a steady state during crystal growth which is very important for growing a good mixed crystal. Otherwise, a partial component(s) of the source material is left behind and will change the composition of the solution. This example describes the growth of double epitaxial layers of the same composition which forms a pn junction therebetween.

In the case of $GaAs_{1-x}P_x$, various kinds of mixed crystals having the characteristics of the respective GaAs and GAP components are obtained according to the value of x.

In FIG. 2A, a boat 6 is provided with two solution crucibles A and B for double layer epitaxial growth. Each 20 g of Ga 7, 7' as the solvent and each 2 g polycrystal 8, 8' of $GaAs_{1-x}P_x$ or of GaAs and GaP are fed into the solution crucibles. The composition of the above polycrystal 8, 8' of $GaAs_{1-x}P_x$ or of GaAs plus GaP as the source crystal is selected to be coincident with the composition of $GaAs_{1-x}P_x$ to be grown. Each crucible A or B has a vertical hollow portion in which the solution and the source material are contained. The substrate comes to the bottom portion. The temperatures of the source crystals 8, 8' and of the substrate 9 are made different with a temperature difference 10. Namely, a vertical temperature gradient is established in each crucible so that the source crystal continuously dissolves into the Ga-solution at the high temperature portion, and an epitaxial layer of the same composition as that of the source crystal continuously grows on the substrate at the low temperature portion. It should be noted that crystal growth can be achieved while maintaining the temperature of the upper feed portion and of the lower growth portion at respective constant values.

Further, thin quartz tubes 10' and 10" (inner diameter: 3 mm$\phi$) having lower temperature feeding sections are inserted onto the solution crucibles A, B as shown in FIG. 2A. The crucibles are applied with lids 11', 11" so as to make them semi-sealed type ones. The low temperature sections are supplied with 1 g of As 11 and 0.5 g of red phosphorus 12 and heated by control furnaces 14 for As and 15 for phosphorus which are separately provided in addition to the main furnace 13 for crystal growth. By changing the temperatures of control furnaces 14 and 15, the pressure of As and P are successfully controlled in the crystal growth section.

The optimum pressures for the mixed crystal $GaAs_{1-x}P_x$ can be determined by the measurements of selected physical property(ies) of the grown layer, as described above. In this case, brightness (or electroluminescence or luminance) of the produced light-emitting (or electroluminescent or luminous) diodes is selected as the determining parameter for discriminating the optimum pressure.

Luminance of a luminous diode is strongly influenced by the quality of the active semiconductor region, and hence is a very good determining parameter. Accordingly, the above-said method of growing double epitaxial layers of the same composition and opposite conductivity type under controlled vapor pressure(s) and of measuring the luminance of the produced luminous diodes is a very effective means for determining the optimum pressures of the mixed crystal of that composition.

Luminous diodes are prepared by double layer crystal growth at 800° C. and 16 kinds of combined pressures. That is, the selected As pressures are 10 Torr, 50 Torr, 100 Torr and 500 Torr, and P pressures are also 10 Torr, 50 Torr, 100 Torr and 500 Torr. Thus, the combined pressures (As-pressure, P-pressure) are the following sixteen kinds: (10, 10), (10, 50), (10, 100), (10, 500), (50, 10), (50, 50), up to (500, 100) and (500, 500). The prepared mixed crystal is $GaAs_{0.7}P_{0.3}$.

The result of these measurements are plotted in FIGS. 2B and 2C, in which the abscissa represents the logarithm of the applied vapor pressure, and the ordinate represents the brightness (or luminance) of the produced homo-junction light-emitting diode in linear scale. It is clearly seen from FIG. 2B that there exist optimum pressures of the volatile elements at which the produced light-emitting diodes exhibit best performance in terms of brightness (or luminance). The luminance shows a maximum value at As pressures of around 50 Torr for all of P pressures tested in these experiments (FIG. 2B), and also shows a maximum value at P pressures of around 50 Torr for all of As pressures tested in these experiments (FIG. 2C). Accordingly, the combined pressures of As and P around (59, 50) in Torr provide the best luminance. The luminance of the diode obtained at the combined pressures of (590, 50) is 7000 ft-L/10 mA which is twofold or more as compared with those of other fifteen kinds of diodes which has luminances of 1000 to 3000 ft-L/10 mA. In this example, the above combination of pressures (50, 50) can be considered as the best one. However, it can be seen from FIGS. 2B and 2C that As and P pressures around 50 Torr satisfactorily give similar results. Furthermore, As and P pressures each in the range of about 30 to 80 Torr give very good results, and those each in the range of about 10 to 250 Torr give preferable results. These pressure ranges are called optimum pressures.

As the result of Lang's X-ray topograph, it is found that the diode produced under the controlled vapor pressure of (50, 50) is dislocation-free. Several experiments like the above are carried out at various temperatures so as to determine the optimum pressures at which good crystals are obtained. The result of the above experiments is shown in FIG. 3A, in which the optimum pressures for producing stoichiometric crystals are represented by the hatched portion X between lines of the equations:

$$P_{opt} \text{ (Torr)} = 4.61 \times 10^6 \exp\left(-\frac{1.01}{KT} eV\right), \text{ and}$$

$$P_{opt}' \text{ (Torr)} = 1.93 \times 10^6 \exp\left(-\frac{1.01}{KT} eV\right),$$

wherein: K represents Boltzmann constant, and T represents the absolute temperature (degrees Kelvin). As will be understood from the graph in FIG. 3A, the logarithm of the optimum pressures decreases linearly with an increase in the inverse of the absolute temperature for crystal growth. Therefore, reliability of the above range is very high, and one can select the optimum pressure combination for growing $GaAs_{0.7}P_{0.3}$ at an arbitrary temperature from FIG. 3A.

Similar experiments are carried out for other compositions x, and optimum pressures for the crystal growth are obtained. It is to be noted that even when the value x in $GaAs_{1-x}P_x$ is changed, the optimum pressures of As and P were found to exist within the hatched range X.

Carrier density in the grown epitaxial layers is also measured. Results of these measurements for $GaAs_{0.7}P_{0.3}$ epitaxial layers are shown in FIG. 3B. In the figure, hatched regions represent the optimum pressure range X obtained by the luminance measurements. When the crystal is grown at 900° C., the carrier density in the grown layer depends on the applied pressure as shown by a dotted curve. Similarly, results of the epitaxial layers grown at 800° C. and 700° C. are shown by a dotted broken curve and by a solid curve. It can be seen that the optimum pressures obtained by the luminance measurements coincide with optimum pressures for the carrier density.

EXAMPLE 2

Figure 4A:
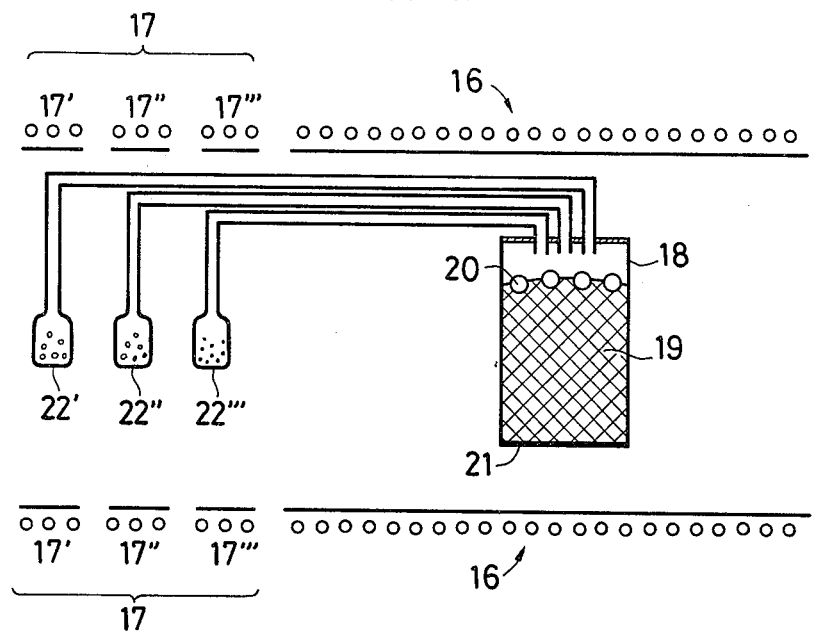
FIG. 4A is a schematic vertical sectional view of another crystal growth apparatus according to another embodiment of the present invention.

In this example, the preparation of a mixed crystal Zn(Te, Se) will be described. The vapor pressures of the constituent elements of II–VI group compounds are all high, so that the deviation from stoichiometric composition can not be avoided in the conventional crystal growth methods. Accordingly, it is necessary to control each of Zn, Te and Se vapor pressures. The crystal growth apparatus used in this example is schematically shown in FIG. 4A.

In like manner as in the foregoing Example 1, three pressure control furnaces 17 (17', 17" and 17"'40 ) are provided in addition to a crystal growth furnace 16. Namely, from the lower temperature side, they are Se-control furnace 17', Zn-control furnace 17" and Te-control furnace 17"'. To the solution crucible 18 are added 20 g of In 19 and 1 g of polycrystals $ZnTe_{0.5}Se_{0.5}$ and crystallization of $ZnTe_{0.5}Se_{0.5}$ is carried out at 900° C. for 3 hours to form an epitaxial layer of 20 μm in thickness on a ZnSe substrate. When the temperatures of the furnaces 17', 17" and 17"' for Se 22', Zn 22" and Te 22"' are respectively set at 638° C., 760° C. and 790° C. during the crystal growth, the mobility in grown mixed crystals is 3000 $cm^2$/V.sec at room temperature which was several times as large as the conventional data.

The relation between Zn pressure and Hall mobility with a running parameter of Te pressure and at Se pressure of about 350 Torr is shown in FIG. 4B. The mobility of carriers in the grown layer becomes maximum at a Zn pressure of around 175 Torr, which may be called the best pressure. Extremely good results are obtainable in a Zn pressure range of about 100 to 200 Torr. Very good results are obtainable in a Zn pressure range of about 25 to 500 Torr. Good results are obtainable in a Zn pressure range of about 10 to 1000 Torr. Similar to Example 1, application of a Te pressure in the range of about 10 to 1000 Torr will promise very good results. In this example, it can be seen that mobility is more sensitive to the Zn pressure. Therefore, when the growth temperature for growing $ZnTe_{0.5}Se_{0.5}$ is selected at 900° C., it is important to apply a Zn pressure in a range of about 10 to 100 Torr, preferably in a range of about 25 to 500 Torr, and more preferably in a range of about 100 to 200 Torr to the solution for obtaining a good electrical property in a grown crystal. The Zn pressure range of about 10 to 1000 Torr is very effective to obtain good electrical results in an epitaxial layer of the system $ZnTe_{1-x}Se_x$ grown at 900° C.

As described above, in case mixed crystal includes a multiplicity of volatile elements, it is necessary to apply each controlled vapor pressure of the volatile elements to ensure stoichiometry.

EXAMPLE 3

Figure 5:
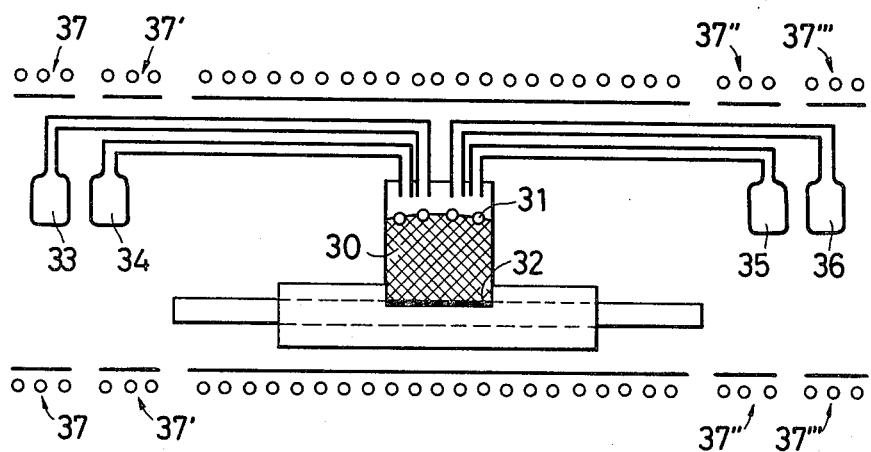
FIG. 5 is a schematic vertical sectional view of a further crystal growth apparatus according to a further embodiment of the present invention.

In this example, an exemplary apparatus for preparing quaternary mixed crystals is shown in FIG. 5. In this apparatus, epitaxial growth is carried out in like manner as the above Example 2 to obtain the mixed crystals of four elements Zn(Se, Te, S) each of which has a high vapor pressure.

In the crystal growth, 20 g of In as a solvent 30 and 0.4 g of polycrystals, $Zn(Se_{0.80}Te_{0.10}S_{0.10})$ as source crystals 31 are used. The temperature difference between the source crystals 31 and a substrate 32 is 40° C. As the substrate 32, a single-crystal (10×10×0.4 mm) of (III)ZnSe is used. After 2 hours' crystal growth, $ZnSe_{0.80}Te_{0.10}S_{0.10}$ single-crystal of 10 μm in thickness is obtained.

The temperature of crystal growth in this experiment is 950° C. and the temperature of the sources Se 33, Zn 34, Te 35 and S 36 for vapor pressure control are controlled respectively at 700° C., 760° C. and 320° C. by using their respective control furnaces 37, 37', 37" and 37"'.

EXAMPLE 4

Figure 6:
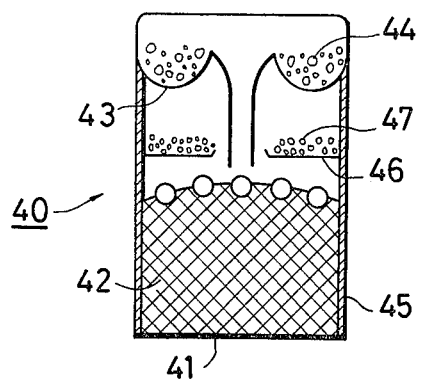
FIG. 6 is a schematic vertical sectional view of a crystal growth apparatus according to another embodiment of the present invention.

When the mixed crystals containing an element which has a high but a relatively low vapor pressure, are produced, the vapor pressure control can be attained by putting such high vapor pressure elements into vapor source chambers integrated with the solution crucible as shown in FIG. 6, without employing the structure as used in the foregoing Examples 1 to 3.

In FIG. 6, only the boat 40 is shown. The internal pressures are regulated by the quantities of ZnSe and GaAs in the boat 40. In this experiment, $(ZnSe)_{0.5}$-$(GaAs)_{0.5}$ crystals are formed on a ZnSe substrate 41 by using Sn solvent 42. A quartz-made jig 43 is integrally mounted on the solution crucible 45 so as to seal it up, and 20 mg of GaAs polycrystals 44 are placed within the jig 43. Further, a shelf 46 is attached to the inside wall of the solution crucible 45 and 300 mg of ZnSe polycrystals 47 are placed on the shelf 46. The solution crucible 45 having an inner volume of 30 ml is supplied with 40 g of Sn solvent 42 and 10 g of $(ZnSe)_{0.5}$-$(GaAs)_{0.5}$ polycrystals. The dimensions of ZnSe substrate 41 are $15 \times 15 \times 0.5$ mm.

EXAMPLE 5

Figure 7:
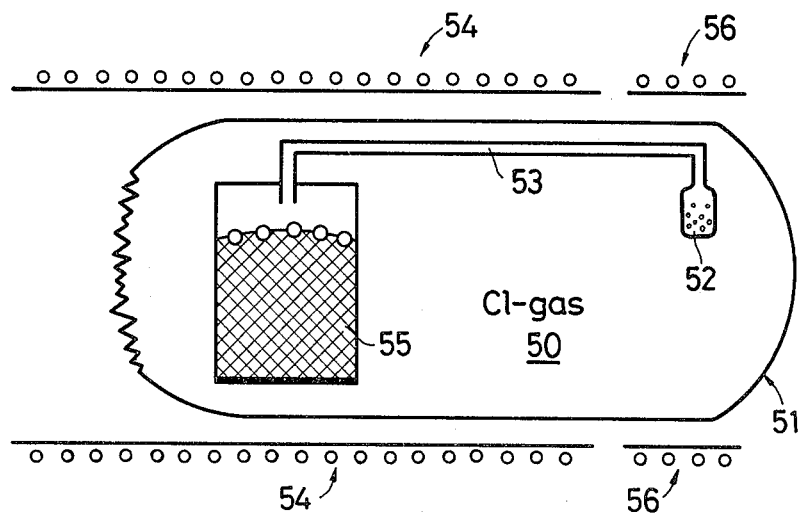
FIG. 7 is a schematic vertical sectional view of a crystal growth apparatus according to another embodiment of the present invention.

In this example, CuCl-GaP mixed crystals are formed by using an apparatus as shown in FIG. 7. A quartz tube 53 carrying phosphorus 52 at a closed end is inserted into an ampoule 51 containing Cl gas 50. Thus, the vapor pressures of P and Cl are controlled. In the crystal growth, the temperature difference between the upper part of the solution crucible 55 and the lower part thereof is made 30° C. by a crystal growth furnace 54 and the vapor pressure of phosphorus 52 is controlled by another furnace 56 at the lower temperature side. Further, the vapor pressure of Cl is controlled by the gas pressure of the enclosed Cl gas.

It will be apparent to those skilled in the art that various modifications, alterations and combinations of the above-described embodiments are readily achievable according to the desired purposes.

For example, a heterojunction diode can be formed by arranging two crucibles each being subjected to independent application of vapor pressures, in line. The growth temperature for the two crucibles may be selected either different or same. Similarly, double hetero structure, multi-hetero structure, or the like can be grown according to the present invention. In forming a multi-layer structure, part of the multiplicity of layers may be grown by the conventional method if that part does not require high quality crystal.

In accordance with the above described method and apparatus, crystals having desired stoichiometric compositions are successfully formed on the substrate plates without substantial difficulty.

Although the present invention has been described in connection with preferred examples thereof, many variations and modifications will now become apparent to those skilled in the art. It will be apparent, therefore, that the present invention is limited not by specific disclosure herein, but only by the appended claims.

What is claimed is:

1. In a solution growth method for producing compound semiconductor mixed crystals in one or more crucibles each containing a solution of a source material and a solid source material which is disposed in contact with the solution which solution is thermally controlled to establish a temperature difference between a high temperature portion and a low temperature portion of said solution in each said crucible such that said high and low temperature are respectively maintained constant, and in which a mixed crystal is deposited on an appropriate substrate disposed at said low temperature portion in each crucible, the improvement comprising:
   (a) positioning said substrate on a slider which can be slidably brought into contact with said solution at said low temperature portion;
   (b) positioning said crucibles in line and supplying at least two of said crucibles from the same pressure source;
   (c) applying to said solution a controlled vapor pressure of each of at least two volatile elements having a relatively higher vapor pressure from a pressure source provided separately from the crucible and a furnace for the crucible through a thin tube, wherein the vapor pressures of said at least two volatile elements are independently controlled through their respective thin tubes;
   (d) supplying each such crucible with the volatile element at a pressure optimum for conducting successive epitaxial growth under a controlled vapor pressure; and
   (e) growing an epitaxial layer on said substrate positioned on said slider at said low temperature portion, while retaining said source material on said solution throughout the growth; wherein the pressure applied to said solution is selected for each such volatile element such that said application of vapor pressure enables growth of a mixed crystal having the same composition as said source material, thereby establishing a substantially steady state of the solution during growth and thereby providing an optimum performance of a predetermined physical property of said mixed crystal.

2. A solution growth method for producing compound semiconductor mixed crystals according to claim 1, wherein: said high temperature portion is located at a top portion and said low temperature portion is located at a bottom portion in said crucible.

3. A solution growth method for producing compound semiconductor mixed crystals according to claim 2, wherein: said solid source material has a specific gravity lower than that of said solution and is floated on the solution.

4. A solution growth method for producing compound semiconductor mixed crystals according to claim 1, wherein: said predetermined physical property is an electrical property or an electrooptical property.

5. A solution growth method for producing compound semiconductor mixed crystals according to claim 1, wherein: said predetermined physical property is that the resulting mixed crystals are free from dislocation.

6. A solution growth method for producing compound semiconductor mixed crystals according to claim 4, wherein: said predetermined physical property is mobility of charge carriers.

7. A solution growth method for producing compound semiconductor mixed crystals according to claim 4, wherein: said mixed crystal constitutes a portion of a light-emitting diode, and said predetermined physical property is luminance of said light-emitting diode.

8. A solution growth method for producing compound semiconductor mixed crystals according to claim 7, wherein: said light-emitting diode comprises compound semiconductor mixed crystal regions of the same composition which forms a pn junction.

9. A solution growth method for producing compound semiconductor mixed crystals according to claim 1, wherein: said mixed crystal is a (III)–(V) mixed crystal where (V) includes at least one of As and P, and the growth of said crystals is carried out at a temperature $T_g$ between about 900° K. and about 1400° K., and said vapor pressure is controlled in the range between about $1.93 \times 10^6 \exp(-1.01/KT_g)$ and $4.61 \times 10^6 \exp(-1.01/KT_g)$, where K represents Boltzmann constant and $KT_g$ is expressed in the unit of electron volt.

10. A solution growth method for producing compound semiconductor mixed crystals according to claim 9, wherein: said mixed crystal is represented by formula $GaAs_{1-x}P_x$, where $0 < X < 1$.

11. A solution growth method for producing compound semiconductor mixed crystals according to claim 10, wherein: said mixed crystal is substantially formed with $GaAs_{0.7}P_{0.3}$, said growth temperature is 800° C. and said vapor pressure is around 50 Torr for As and around 50 Torr for P.

12. A solution growth method for producing a compound semiconductor mixed crystal of the formula:

$$GaAs_{1-x}P_x$$

where $0 < X > 1$, said method comprising the steps of:
(1) providing a first crucible and a second crucible for double epitaxial growth,
(2) introducing into each of the crucibles a solution of source material and solid source material containing a volatile element therein in contact with said solution and supplying said crucibles from the same pressure source with said volatile element at a pressure for conducting successive epitaxial growth under a controlled vapor pressure condition;
(3) controlling the temperature of said first crucible independently of the temperature of said second crucible to establish in each of said crucibles a temperature difference between a top portion and a bottom portion of said solutions and adjusting the temperature of each of said crucibles at respective constant values;
(4) applying to each of said solutions a controlled vapor pressure of each of the volatile elements contained in said source material through a thin tube from a pressure source separate from the crucible, said volatile elements having a relatively higher vapor pressure;
(5) positioning a substrate for epitaxial growth on a slider adapted to be contacted with the low temperature portion of said solution; and
(6) successively growing epitaxial layers of said compound semiconductor mixed crystal on said substrate positioned at the bottom portions of said first and second crucibles while said source material remains at the top portion of each of said crucibles or said solution;
wherein said source material and said vapor pressure are selected to provide a substantial coincidence of the composition of said epitaxial layer with said source material and the epitaxial layers of said compound semiconductor mixed crystal, said crystal exhibiting optimum performance of a predetermined physical property.

13. A solution growth method for producing a compound semiconductor mixed crystal according to claim 12, wherein: said source material and the resulting mixed crystal both have the same composition of $GaAs_{0.7}P_{0.3}$, said growth temperature is about 800° C. and said vapor pressure for As is in the range of 10 to 500 Torr and said vapor pressure for P is in the range of 10 to 500 Torr.

14. A solution growth method for producing compound semiconductor mixed crystals according to claim 1, wherein: said mixed crystals are selected from a group consisting of (III)–(V) mixed crystals, (II)–(VI) mixed crystals, (II)–(III)–(VI) mixed crystals, (II)–(IV)–(V) mixed crystals, (IV)–(VI) mixed crystls, (I)–(III)–(VI) mixed crystals, (I)–(V)–(VI) mixed crystals, (II)–(VI)–(VII) mixed crystals, (III)–(IV)–(VI) mixed crystals, (IV-V, IV-VI) mixed crystals, (I-VII, III-V) mixed crystals, (II-IV-V, III-V) mixed crystals, (IV-VI, III-V) mixed crystals, (I-III-VI, II-VI) mixed crystals, and (II-VI, IV-VI) mixed crystals.

15. A solution growth method for producing compound semiconductor mixed crystals according to claim 14, wherein: said (III)–(V) mixed crystals are (III, III)-V mixed crystals selected from a group consisting of (In, Ga)P, (In, Ga)As, (In, Ga)Sb, (Ga, Al)P, (Ga, Al)As, (Ga, Al)Sb, (In, Ga)N, (Ga, Al)N, (In, Al)P, (In, Al)Sb, (In, Al)As and (In, Al)N.

16. A solution growth method for producing compound semiconductor mixed crystals according to claim 14, wherein: said (III)–(V) mixed crystals are III–(V, V) mixed crystals selected from a group consisting of Ga(As, P), In(As, P), Al(As, P), In(As, Sb), Ga(As, Sb), Ga(P, Sb), Al(As, Sb), Al(P, Sb), Ga(P, N) and Al(P, N).

17. A solution growth method for producing compound semiconductor mixed crystals according to claim 14, wherein: said (II)–(VI) mixed crystals are (II, II)-VI mixed crystals selected from a group consisting of (Zn, Cd)S, (Zn, Hg)S, (Hg, Cd)S, (Zn, Cd)Se, (Zn, Hg)Se, (Hg, Cd)Se, (Zn, Cd)Te, (Zn, HG)Te and (Cd, Hg)Te.

18. A solution growth method for producing compound seiconductor mixed crystals according to claim 14, wherein: said (II)–(VI) mixed crystals are II–(VI, VI) mixed crystals selected from a group consisting of Zn(S, Se), Cd(S, Se), Hg(S, Se), Zn(S, Te), Cd(S, Te), Hg(S, Te), Zn(Se, Te), Cd(Se, Te) and Hg(Se, Te).

19. A solution growth method for producing compound semiconductor mixed crystals according to claim 14, wherein: said (III)–(V) mixed crystals are selected from a group consisting of (Al, Ga)AsP, (In, Ga)AsP, (In, Al)AsP, (In, Ga)SbAs and (Al, Ga)PSb.

20. A solution growth method for producing compound semiconductor mixed crystals according to claim 14, wherein: said (IV)–(VI) mixed crystals are selected from a group consisting of (Pb, Sn)Te, (Ge, Si)Te, Ge(Te, S) and Si(Se, Te).

21. A solution growth method for producing III–V mixed crystals from a solution, comprising the steps of:
(1) introducing into a crucible a solution of source material and thereon a solid source material containing volatile elements therein, said crucible having a source-feeding portion and a crystal growing portion;
(2) providing a substrate on a slider adapted to contact the crucible at the crucible growing portion thereof;
(3) controlling the temperature in the crucible to establish a temperature difference between the source-feeding portion and the crystal-growing portion and to maintain the temperature of the respective portions at respective constant predetermined values;

(4) applying, during epitaxial growth, a vapor pressure of each of the Group V elements of the constituents of said mixed crystal, the vapor pressure being in the range between $1.93 \times 10^6 \exp(-1.01/KT_g)$ and $4.61 \times 10^6 \exp(-1.01/KT_g)$, wherein K represents the Boltzmann constant, Tg represents the growth temperature in degrees Kelvin, and $KT_g$ is expressed in electron volt units; and (5) growing an epitaxial layer of said III–V mixed crystal on a substrate disposed at said crystal-growing portion while said vapor pressure is applied and said source material remains at said source-feeding portion;

wherein the vapor pressures are selected at such values that the epitaxial layer of the III–V mixed crystal has substantially the same composition as that of said source material for establishing a steady state during crystal growth.

22. A solution growth method according to claim 21, wherein: said III–V mixed crystal is $GaAs_{0.7}P_{0.3}$, said growth temperature is about 800° C. and said vapor pressure is about 50 Torr.

23. An apparatus for producing compound semiconductor mixed crystals, comprising:

at least two substantially closed crucibles each adapted to contain a solution of source material and solid source material therein, including a top and a bottom portion, the bottom of each such crucible having means for growing the mixed crystal contained therein successively and epitaxially on a substrate mounted on a carrier means disposed at the bottom of each of the crucibles;

a heating means for establishing a temperature difference between a top portion and a bottom portion of each said solution such that the temperature of said top portion is higher than the temperature of said bottom portion, the temperature difference between the two portions being held at substantially constant values;

at least two thin tubes each communicating with each of said crucibles at one end with the inside of a space located above said top portion in each said crucible and having a lower temperature feeding section located at the opposite end to contain therein one of at least two volatile elements of said mixed crystal; and at least two heating means for controlling temperatures of said lower temperature feeding sections independently of one another and thereby providing controlled vapor pressures; said heating means adapted to provide optimum vapor pressures of said volatile elements for conducting successive epitaxial growth under a controlled vapor pressure required for growing epitaxial layer having substantially the same composition as that of said source material.

* * * * *

UNITED STATES PATENT AND TRADEMARK OFFICE
CERTIFICATE OF CORRECTION

PATENT NO. : 4,315,796

DATED : February 16, 1982

INVENTOR(S) : Nishizawa

It is certified that error appears in the above–identified patent and that said Letters Patent are hereby corrected as shown below:

On the title page,

Item [30] delete "Mar. 10, 1978" insert --Aug. 24, 1976--.

Item [56] delete "Hot Crystal" insert --J. Crystal--.

Column 1, lines 38-39, delete "desinging" insert --designing--.

Column 5, line 10, delete "$GaAs_xP_{1-x}$" insert --$GaAs_{1-x}P_x$--.

Column 5, line 19, delete "$GaAs_xP_{1-x}$" insert --$GaAs_{1-x}P_x$--.

Column 6, line 11, delete "(In, Ga)p" insert --(In, Ga)P--.

Column 6, line 13, after "(Ga,Al)N" insert --,--.

Column 6, line 19, delete "Al(P, Sb)" insert --Aℓ(P, Sb)--.

Column 6, line 23, delete "InAl" insert --In, Al--.

Column 6, line 59, delete "(IV)-(VI)" insert --(IV)-(IV)-(VI)--.

Column 7, line 14, delete "CuCl-Gap" insert --CuCl-GaP--.

UNITED STATES PATENT AND TRADEMARK OFFICE
CERTIFICATE OF CORRECTION

PATENT NO. : 4,315,796
DATED : February 16, 1982
INVENTOR(S) : Nishizawa

It is certified that error appears in the above-identified patent and that said Letters Patent are hereby corrected as shown below:

Column 7, line 18, delete "GeTe-GaAS" insert --GeTe-GaAs--.

Column 7, line 19, delete "SiS-Gap" insert --SiS-GaP--.

Column 7, line 33, delete "AS" insert --As--.

Column 7, line 59, delete "GAP" insert --GaP--.

Column 7, line 66, delete "GaAS" insert --GaAs--.

Column 7, line 68, delete "GaAS" insert --GaAs--.

Column 9, line 1, delete "(59, 50)" insert --(50, 50).

Column 9, line 3, delete "(590, 50) insert --(50, 50)--.

Column 10, line 4, delete "(... and 17"40)" insert

--(... and 17'")--.

Column 10, line 60, delete "(III)" insert --(111)--.

UNITED STATES PATENT AND TRADEMARK OFFICE
CERTIFICATE OF CORRECTION

PATENT NO. : 4,315,796
DATED : February 16, 1982
INVENTOR(S) : Nishizawa

It is certified that error appears in the above-identified patent and that said Letters Patent are hereby corrected as shown below:

Column 13, line 14, delete "0<X<1" insert --0<x<1--.

Column 13, line 26, delete "0<X<1" insert --0<x<1--.

Column 14, line 37, delete "(Zn, HG)" insert --(Zn, Hg)--.

Column 14, line 63, delete "crucible" insert --crystal--.

Signed and Sealed this

Eighth Day of February 1983

[SEAL]

Attest:

Attesting Officer

GERALD J. MOSSINGHOFF

Commissioner of Patents and Trademarks